United States Patent [19]
Chen et al.

[11] Patent Number: 5,319,245
[45] Date of Patent: Jun. 7, 1994

[54] LOCAL INTERCONNECT FOR INTEGRATED CIRCUITS

[75] Inventors: Fusen Chen, Dallas; Fu-Tai Liou, Carrollton; Girish Dixit, Dallas, all of Tex.

[73] Assignee: SGS-Thomson Microelectronics, Inc., Carrollton, Tex.

[21] Appl. No.: 981,908

[22] Filed: Nov. 23, 1992

Related U.S. Application Data

[63] Continuation of Ser. No. 695,583, May 3, 1991, abandoned.

[51] Int. Cl.$^5$ ............ H01L 23/48; H01L 29/46; H01L 29/62; H01L 29/64
[52] U.S. Cl. ............ 257/751; 257/741; 257/750; 257/754; 257/757; 257/764; 257/768; 257/770; 257/915
[58] Field of Search ............ 357/67, 71, 42; 257/741, 750, 751, 754, 757, 764, 768, 770, 915; 437/190, 200, 202

[56] References Cited

U.S. PATENT DOCUMENTS

| | | | |
|---|---|---|---|
| 4,804,636 | 2/1989 | Groover III et al. | 357/42 |
| 4,829,363 | 5/1989 | Thomas et al. | 357/71 |
| 4,873,204 | 10/1989 | Wong et al. | 357/67 |
| 4,933,742 | 6/1990 | Brown et al. | |
| 4,962,414 | 10/1990 | Liou et al. | 257/91.3 |
| 4,978,637 | 12/1990 | Liou et al. | |
| 5,049,975 | 9/1991 | Ajika et al. | 257/770 |

FOREIGN PATENT DOCUMENTS 0072522 2/1983 European Pat. Off. .
0209654 1/1987 European Pat. Off. .

OTHER PUBLICATIONS

*IEEE Transactions on Electron Devices*, vol. ED-34, 1987, Thomas E. Tang, Che-Chia Wei, Roger A. Haken, Thomas C. Holloway, Larry R. Hite, and Terence G. W. Blake, "Titanium Nitride Local Interconnect Technology for VLSI", pp. 682-688.

*Primary Examiner*—J. Carroll
*Attorney, Agent, or Firm*—Lisa K. Jorgenson; Kenneth C. Hill; Richard K. Robinson

[57] ABSTRACT

A method for fabrication of local interconnects in an integrated circuit, and an integrated circuit formed according to the same, is disclosed. According to the disclosed embodiment, a first and a second conductive structure are formed over the integrated circuit. An insulating layer is formed over the integrated. A first photoresist layer is formed over the insulating layer, patterned and developed. The insulating layer is etched to expose selected regions of the first and second conductive structures. A refractory metal layer is formed over the integrated circuit. A barrier layer is formed over the refractory metal layer, and optionally a refractory metal silicide layer is formed over the barrier layer. A second photoresist layer is formed over the barrier layer, patterned and developed. The refractory metal layer and barrier layer, and the refractory metal silicide layer if formed, are etched to define a conductive interconnect between the exposed selected regions of the first and second conductive structures.

9 Claims, 2 Drawing Sheets

LOCAL INTERCONNECT FOR INTEGRATED CIRCUITS

This is continuation of application Ser. No. 07/695,583 filed May 3, 1991 abandoned.

TECHNICAL FIELD

The present invention relates generally to semiconductor integrated circuit processing, and more specifically to forming a conductive interconnection on integrated circuits.

BACKGROUND OF THE INVENTION

With the trend to continue to miniaturize semiconductor integrated circuits to achieve submicron feature sizes, local interconnection has become of prime importance in semiconductor manufacturing. Local interconnects have been used to achieve increased packing density in sub-micron integrated circuit designs. Local interconnects are an extra level of interconnect used for connecting closely spaced elements in a layout design.

Local interconnects typically do not cross over any portion of other interconnect layers, although they may cross over field oxide regions. Local interconnects may be used to connect N+ regions to P+ regions or to connect source/drain regions to gates. Local interconnects must meet certain basic requirements to achieve the objective of increased packing density. The materials used for the local interconnects must provide for low contact resistance to source/drain regions and provide low sheet resistance. In order to prevent subsequent severe topography, local interconnects must be thin, e.g., less than 2500 Angstroms. Further, local interconnects must be capable of acting as a barrier to prevent interdiffusion of dopants between P and N regions.

Numerous techniques have been used to implement local interconnects. These techniques typically introduce new processing technologies above and beyond those used for the remainder of the device fabrication process flow. Such techniques include, for example, the use of titanium nitride for the local interconnect. Titanium is deposited and followed by a thermal treatment. However, this technique creates high sheet resistance and discontinuity over source/drain regions due to the thinning of the titanium nitride layer. An additional layer of titanium nitride may be formed by depositing titanium followed again by a thermal treatment to overcome these problems but the process steps then become complicated.

Another technique includes the use of a polycide layer for the local interconnect. Selective deposition of refractory metals on silicon has also been proposed for local interconnects. The quality of the conducting element formed using such techniques varies, with some techniques resulting in fairly good conductors. Such techniques, however, typically introduce additional process complexity to the normal process flow. This additional complexity tends to decrease device yield and increase cost.

It is desirable to use local interconnection in integrated circuit design because of the layout area savings. It would be desirable to provide a local interconnection fabrication technique which does not introduce additional process complexities.

SUMMARY OF THE INVENTION

Therefore, according to the present invention, after forming a first and a second conductive structure on the integrated circuit, an insulating layer is formed over the integrated circuit. The insulating layer is then etched to expose selected regions of the first and second conductive structures. A refractory metal layer is formed over the integrated circuit. A barrier layer is formed over the refractory metal layer, and optionally a refractory metal silicide layer is formed over the barrier layer. The refractory metal layer and the barrier layer, and the refractory metal silicide layer if formed, are etched to define a conductive interconnect between the exposed selected regions of the first and second conductive structures.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
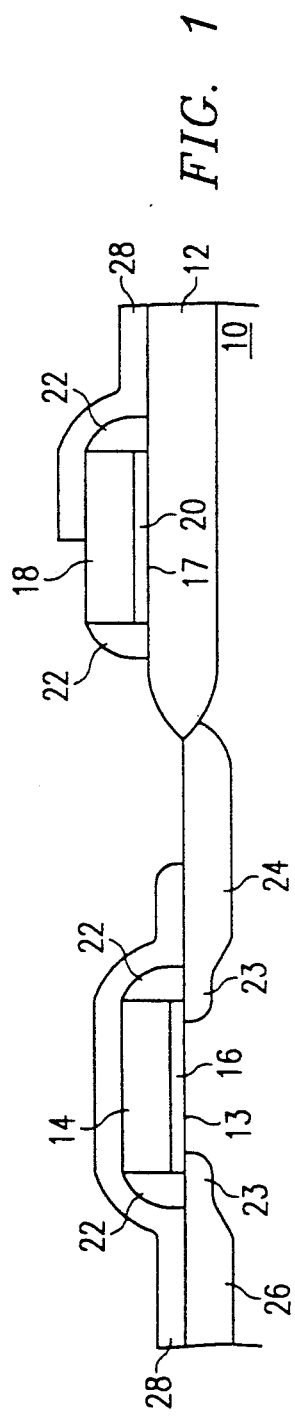
FIGS. 1-6 illustrate a preferred process flow according to the present invention.

Referring to FIG. 1, an integrated circuit is to be formed in a substrate 10. Selected regions of the substrate 10 are oxidized to form a field oxide 12. Field oxide region 12 is used to separate active regions of the device. Active devices such as field effect transistors are formed in those portions of the substrate 10 not covered by field oxide 12.

Conductive structure 13 includes a polycrystalline silicon gate electrode 14 and a thin gate oxide 16. Gate electrode 14 may be doped polycrystalline silicon, a refractory metal silicide, or a combination of layers of polycrystalline silicon and a refractory metal silicide, as known in the art.

Lightly doped drain regions 23 and source/drain regions 24, 26 are formed. Lightly doped drain regions 23 are defined using sidewall oxide spacers 22 as known in the art.

Conductive structure 17 is formed by methods known in the art over field oxide region 12. Conductive structure 17 includes a polycrystalline silicon gate electrode 18 and a thin gate oxide 21. Conductive structure 17 also has sidewall oxide spacers 22. Since conductive structures 13 and 17 are formed simultaneously, they are both constituted from the same materials, preferably being a silicided polycrystalline silicon as described above.

Device fabrication up to this stage utilizes conventional process steps well known in the art. For purposes of illustrating one technique for forming local interconnects, it will be assumed that a local interconnect conductor needs to be formed between source/drain region 24 and conductive structure 17. The first step in forming such local interconnect is to deposit an oxide insulating layer 28 over the integrated circuit device. Oxide layer 28 may be deposited, for example, to a depth of approximately 1,000 Angstroms. Oxide layer 28 is patterned and etched to define the shape shown in FIG. 1 exposing the areas that are to be connected with the local interconnect.

Figure 2:
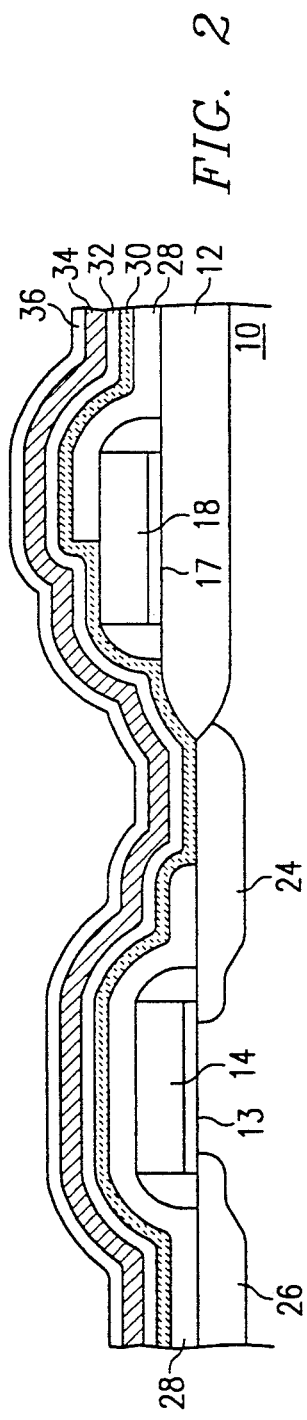

Referring to FIG. 2, a refractory metal layer 30 such as titanium is deposited by methods known in the art over the integrated circuit. A barrier layer 32 such as titanium nitride is deposited over the refractory metal layer 30. A refractory metal silicide layer 34 such as tantalum silicide is preferably deposited next over barrier layer 32. A photoresist layer 36 is then spun onto the integrated circuit, patterned and developed.

Figure 3:
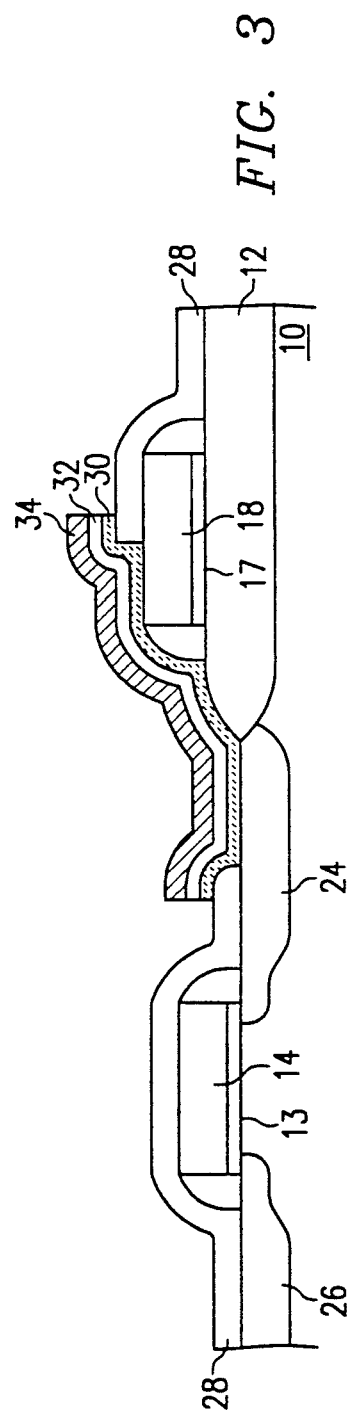

Referring to FIG. 3, layers 30, 32 and 34 if it is formed, are etched to define a local interconnect conductor between source/drain region 24 and conductive structure 17. Refractory metal layer 30 provides good contact resistance to both the source/drain region 24 and conductive structure 17. Layer 30 will be partially or totally consumed to form a silicide in the source/drain region during subsequent steps. The barrier layer 32 prevents dopant interdiffusion between the connected active areas. The refractory metal silicide layer 34 protects the barrier layer from oxidizing and provides low resistance for increased device performance.

If the refractory metal silicide layer 34 is not deposited, the refractory metal layer 30 must undergo a thermal treatment before the barrier layer 32 is deposited such as rapid thermal annealing or rapid thermal processing or by furnace reflow. The titanium is annealed in a nitrogen ambient by rapid thermal annealing (RTA) or furnace annealing, heating the wafer uniformly. The titanium is converted to titanium nitride except where it reacts with the underlying source/drain region 24 to form titanium disilicide.

The use of the RTA process to form titanium disilicide reduces the contact resistance. The addition of titanium nitride as a barrier layer 32 after the RTA process increases the total thickness of titanium nitride and provides for better conductivity. The additional barrier layer further prevents outdiffusion of dopants. Because the RTA process converts titanium to titanium nitride, the addition of barrier layer 32 may not be necessary. In this case, a refractory metal silicide layer 34 such as tantalum silicide may be formed over the refractory metal layer after the RTA process to prevent oxidation of the underlying layer.

Figure 4:
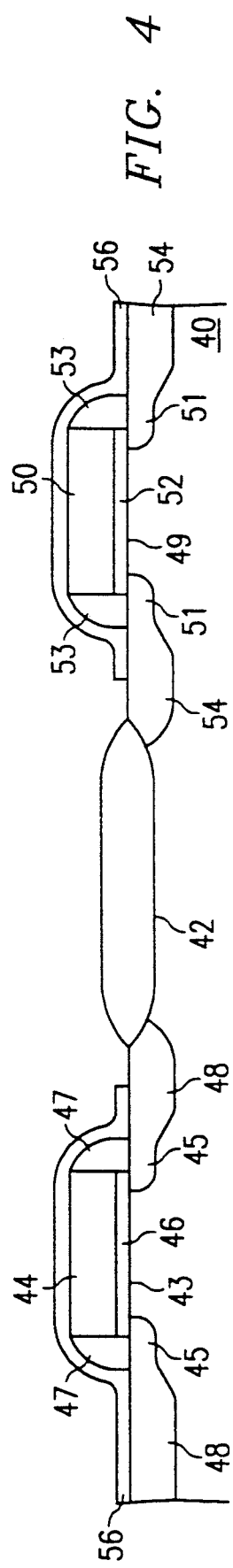

Referring to FIG. 4, an alternative embodiment of the present invention is shown. An integrated circuit device is to be formed in a semiconductor substrate 40. Field oxide region 42 is used to separate active regions of the device. Conductive structure 43 of a field effect transistor is formed and includes a gate electrode 44 and a thin gate oxide 46. Conductive structure 49 of a field effect transistor includes a gate electrode 50 and a thin gate oxide 52.

Lightly doped drain regions 45 and 51 and source/drain regions 48 and 54 are formed. Lightly doped drain regions 45 and 51 are defined using oxide sidewall spacers 47 and 53, respectively as known in the art.

For purposes of illustrating the alternative embodiment, it will be assumed that a local interconnect conductor needs to be formed between source/drain region 48 and source/drain region 54. Source/drain regions 48 and 54 are of different conductivity type. If source/drain 48 is N-type, then source/drain region 54 is P-type and vice versa.

An oxide insulating layer 56 is deposited over the integrated circuit device. Oxide layer 56 again may be deposited, for example, to a depth of approximately 1,000 Angstroms. Oxide layer 56 is patterned and etched to define the shape shown in FIG. 4 exposing selected regions that are to be connected with the local interconnect.

Figure 5:
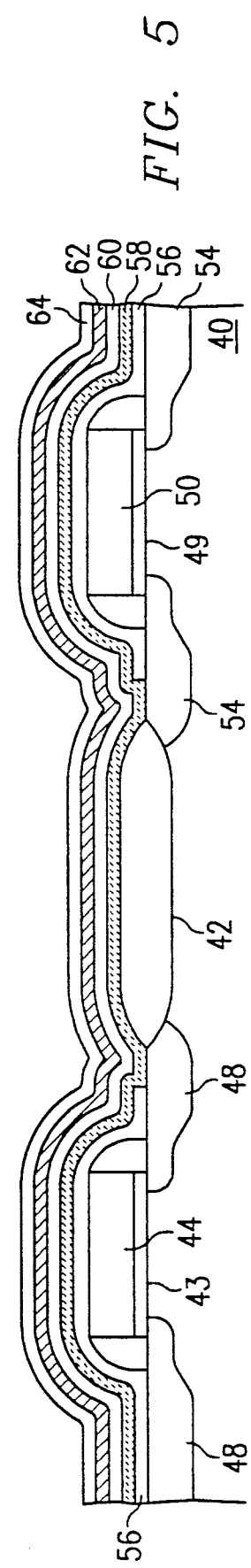

Referring to FIG. 5, a refractory metal layer 58 such as titanium is deposited by methods known in the art over the integrated circuit. A barrier layer 60 such as titanium nitride is deposited over the refractory metal layer 5s. A refractory metal silicide layer 62 such as tantalum silicide is again preferably deposited next over barrier layer 60. A photoresist layer 64 is then spun onto the integrated circuit, patterned and developed.

Figure 6:
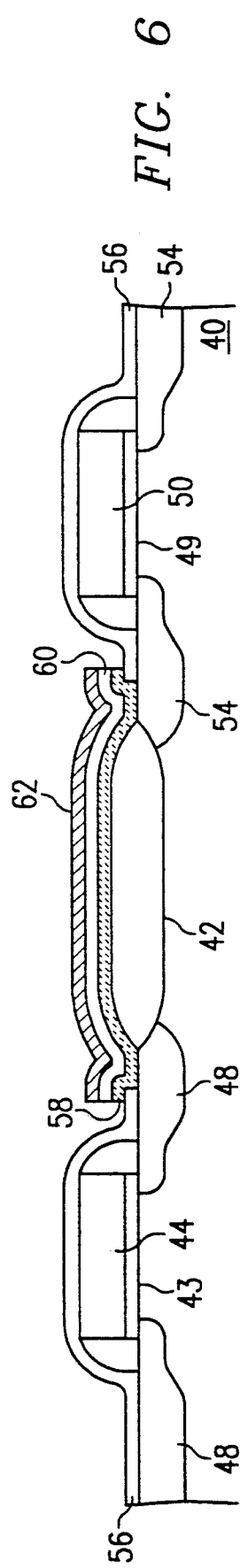

Referring to FIG. 6, layers 58, 60 and 62 are etched to define a local interconnect conductor between source/drain region 48 and source/drain region 54. Refractory metal layer 58 again provides good contact resistance to both source/drain region 48 and 54. Layer 58 will be partially or totally consumed to form a silicide during subsequent steps. The barrier layer 60 prevents dopant interdiffusion between the connected active areas 48 and 54. The refractory metal silicide layer 62 protects the barrier layer 60 from oxidizing and provides low resistance for increased device performance. As described above, if the refractory metal silicide layer 62 is not deposited, the refractory metal layer 58 must undergo a thermal treatment before the barrier layer 60 is deposited. This process of making a local interconnect may also be use to connect the gate electrode regions of two conductive structures.

The local interconnect shown provides for low contact resistance to source/drain regions and reduces sheet resistance. The interconnect further prevents dopant interdiffusion between P and N type dopants and provides for a minimal amount of severe topography changes by depositing a thin refractory metal layer.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. An interconnect structure consisting of a portion of a semiconductor integrated circuit, comprising:
   a substrate;
   a first and a second conductive structure disposed over the integrated circuit and separated by an insulating layer;
   a first annealed refractory metal nitride layer disposed over a portion of the insulating layer, and contacting selected portions of the first and second conductive structures;
   a second deposited refractory metal nitride barrier layer disposed over the first annealed refractory metal layer; and a refractory metal silicide layer disposed over the barrier layer.

2. The device of claim 1, wherein the refractory metal nitride comprises titanium nitride.

3. The device of claim 1, wherein the second deposited refractory metal nitride layer comprises titanium nitride.

4. The device of claim 1, wherein the refractory metal silicide layer comprises tantalum silicide.

5. The device of claim 1, wherein the first and second conductive structures comprise source/drain regions.

6. The device of claim 1, wherein the first conductive structure comprises a source/drain region and the second conductive structure comprises a gate electrode.

7. A conductive structure for an integrated circuit, comprising:

first and second conductive structures disposed within the integrated circuit, and separated by an insulating region;

a first interconnect layer lying on the insulating region and connecting the first and second conductive structures, such layer being formed from titanium nitride, and having physical properties resulting from formation by annealing a titanium layer in a nitrogen ambient to form the titanium nitride;

a second interconnect layer lying on the first interconnect layer, such layer being formed from titanium nitride, and having physical properties resulting from formation by direct deposition of titanium nitride;

refractory metal silicide regions within the first and second conductive structures where they are in contact with the refractory metal interconnect, wherein the refractory metal forming the silicide regions is the same material as the refractory metal in the refractory metal nitride interconnect; and a refractory metal silicide layer overlaying the second interconnect layer and coextensive therewith.

8. The conductive structure of claim 7, wherein the refractory metal interconnect comprises titanium nitride, whereby the refractory metal silicide regions comprise titanium silicide.

9. The conductive structure of claim 8, wherein the refractory metal silicide layer comprises tantalum silicide.

* * * * *